(12) United States Patent
Hamadeh

(10) Patent No.: US 9,480,141 B1
(45) Date of Patent: Oct. 25, 2016

(54) HEAT SINK DEVICE OR HEAT SINK ASSEMBLY

(71) Applicant: Junis Hamadeh, St. Petersburg, FL (US)

(72) Inventor: Junis Hamadeh, St. Petersburg, FL (US)

( * ) Notice: Subject to any disclaimer, the term of this patent is extended or adjusted under 35 U.S.C. 154(b) by 305 days.

(21) Appl. No.: 14/032,908

(22) Filed: Sep. 20, 2013

Related U.S. Application Data

(60) Provisional application No. 61/703,339, filed on Sep. 20, 2012.

(51) Int. Cl.
*H05K 1/02* (2006.01)
*H01R 12/00* (2006.01)

(52) U.S. Cl.
CPC ............ *H05K 1/0204* (2013.01); *H01R 12/00* (2013.01)

(58) Field of Classification Search
None
See application file for complete search history.

(56) References Cited

U.S. PATENT DOCUMENTS

| | | | |
|---|---|---|---|
| 3,783,433 A | 1/1974 | Kurtz et al. | |
| 5,090,918 A * | 2/1992 | Zoellick et al. | 439/487 |
| 5,806,181 A * | 9/1998 | Khandros et al. | 29/874 |
| 6,137,064 A | 10/2000 | Kiani et al. | |
| 6,388,208 B1 * | 5/2002 | Kiani et al. | 174/266 |
| 6,428,189 B1 | 8/2002 | Hochstein | |
| 6,517,218 B2 | 2/2003 | Hochstein | |
| 7,638,814 B2 | 12/2009 | Wall, Jr. et al. | |
| 8,053,799 B2 | 11/2011 | Kwon et al. | |
| 8,148,646 B2 * | 4/2012 | Fan et al. | 174/261 |
| 8,564,956 B2 * | 10/2013 | Grajcar | 361/712 |
| 8,604,357 B2 * | 12/2013 | Takeda | 174/261 |
| 2002/0179332 A1 * | 12/2002 | Uematsu et al. | 174/262 |
| 2003/0192176 A1 * | 10/2003 | Eldridge et al. | 29/832 |
| 2004/0251047 A1 | 12/2004 | Bartley et al. | |
| 2005/0234522 A1 | 10/2005 | Ley et al. | |
| 2006/0012967 A1 * | 1/2006 | Asai et al. | 361/764 |
| 2007/0137891 A1 | 6/2007 | Fan et al. | |
| 2010/0088886 A1 | 4/2010 | Wang | |
| 2011/0004283 A1 * | 1/2011 | Stevenson et al. | 607/116 |
| 2011/0287563 A1 * | 11/2011 | Lin et al. | 438/26 |
| 2014/0284785 A1 * | 9/2014 | Sung et al. | 257/692 |

\* cited by examiner

*Primary Examiner* — Courtney Smith
(74) *Attorney, Agent, or Firm* — Glenn E. Gold, P.A.

(57) ABSTRACT

A heat sinking rapid assembly semiconductor package comprising an electrically segmented conductive assembly post. The post is fabricated comprising at least two independent electrically conductive segments separated by an electrically isolating element. An electrical component, such as a semiconductor device, is assembled to an upper portion of the conductive post, wherein each contact of the component is in electrical communication with a respective conductive segment. The post can be mechanically pressed, threaded, or mechanically coupled using any other reasonable mechanical interface into a segmented via or plated-through hole of a printed circuit board (PCB). The electrical segments would be in electrical communication with conductive portions of the segmented via to form a complete electrical circuit between the PCB and the electrical component. A thermally conductive element can be integrated into the post to conduct heat away from the semiconductor device to improve performance and reduce failures related to thermal stress.

21 Claims, 12 Drawing Sheets

HEAT SINK DEVICE OR HEAT SINK ASSEMBLY

CROSS-REFERENCE TO RELATED APPLICATION

This Non-Provisional Utility application claims the benefit of U.S. Provisional Patent Application Ser. No. 61/703,339, filed on Sep. 20, 2012, which is incorporated herein in its entirety.

FIELD OF THE INVENTION

The present disclosure generally relates to an electronic component assembly designed for improved heat sinking and rapid installation in a printed circuit board. More particularly, the present disclosure relates to a semiconductor, such as a Light Emitting Diode (LED), mounted on a threaded post that provides electrical and thermal communication between the LED and the circuit board providing both electrical power to and heat dissipations from the LED.

BACKGROUND OF THE INVENTION

Light emitting diodes (LED's) are commonly used for many applications, including displays, electronic status identifications, lighting applications, and the like. In electronic applications, LED's are often used as indicators. In a simple application, an LED is commonly used in a wide variety of consumer electronics, where the LED would be illuminated to indicate that power is available to a device, that the device is turned on, that the device is turned off, and the like. LED's may also be used to indicate when data is being transferred by an electronic communication device, such as a modem, an Ethernet switch, a router, and the like. Additionally they may be used in commercial or industrial applications for information displays, indicators, or other reasons. Current trends continue the increase the inclusion of high power LED's in industrial and commercial lighting applications. These LED's are slightly different from LED's used in common consumer applications, where the high power LED's require much better heat dissipation in order to extend their lifespan. Specialized dielectrics have been developed as one resolution to address the heat dissipation requirements, however, this solution is provided at a significantly high cost.

LED's can be used in a wide range of lighting applications, including reading lights, portable flashlights, accent and decorative lighting, traffic signals, and exterior automotive signals, and the like. These and other applications vary widely in terms of color, brightness and luminescence required.

Typically, LED devices comprise a small semiconductor die assembled into a package. The LED semiconductor die is attached to a support substrate, which provides mechanical support and the necessary electrical conduits for providing electrical communication between a printed circuit assembly and the LED. A lens is assembled to the support substrate in an arrangement to disburse the light emitted by the light emitting semiconductor die. When electrical power is provided to the semiconductor die, the die produces light that is dispersed through the lens. Often, it is convenient to mount an LED directly onto a printed circuit board (PC board) both to incorporate the LED in the electronic device, and to provide power to the LED from the PC board circuitry.

LED's also dissipate heat during operation. Without using the proper precautions, they can build up enough heat within the LED to cause a reduction in light output, or ultimately failure of the LED device. It is well known in the LED semiconductor industry that the light output from an LED device decreases with increasing junction temperature, as illustrated in the Luxeon Emitter Technical Datasheet DS25. It is common practice to mount these LED onto PC boards that contain specialized dielectrics providing a suitable thermally conductive heat sink for the purpose of drawing heat away from the die to maintain higher light output, and prevent thermally related device failures. However, at best, these specialized dielectrics conduct at a rate of 3 W/m-K, which is not considered to be very good.

What is desired is an LED heat sink assembly that provides improved thermal management without specialized and costly dielectrics for the LED semiconductor device, resulting in improved light output and at a reduced cost.

Additionally desired is an improved method to assemble the LED heat sink assembly to a printed circuit board without using solder or soldering techniques to make the connection.

SUMMARY OF THE INVENTION

The basic inventive concept provides a heat sinking rapid assembly semiconductor package.

A first aspect of the present invention provides a rapid insertion assembly semiconductor package comprising:
 a semiconductor device;
 a rapid insertion post subassembly comprising:
 a first electrically conductive post element disposed along and forming a first longitudinal portion of a circumference of said rapid insertion post subassembly,
 a first mechanical attachment interface disposed upon an exterior surface of said first conductive element,
 wherein said first conductive post element is in electrical communication with a first lead of said semiconductor device;
 a second conductive post element disposed along and forming a second longitudinal portion of a circumference of said rapid insertion post subassembly,
 a second mechanical attachment interface disposed upon an exterior surface of said second conductive element,
 wherein said second conductive post element is in electrical communication with a second lead of said semiconductor device; and
 an electrically isolating element disposed longitudinally along a center of said rapid insertion post subassembly, wherein said electrically isolating element electrically isolates said first conductive post element and second conductive post element,
 wherein said semiconductor device is carried by an upper surface of said rapid insertion post subassembly.

In a second aspect, the mechanical attachment interface disposed on the exterior surface of the first and second conductive post elements is used to facilitate connection and attachment of the heat sink post within a plated-through hole of a circuit board.

In another aspect, the mechanical attachment interface can be formed having threads, a clip, a hook, and the like.

In another aspect, the plated-through hole in the printed circuit board further comprises a segmented via, having a first conductive segment and a second conductive segment that are electrically isolated from one another.

In yet another aspect, the segmented via in the printed circuit board is created using a secondary drilling or milling operation to locally remove portions of a continuous conductive segment in the barrel of the plated-through hole to form the first and second conductive segments.

In another aspect, the threads mechanical attachment interface disposed on the exterior surface of the first and second conductive post elements of the heat sink post make electrical contact with first and second conductive segments, respectively, of the segmented via.

In yet another aspect, the heat sink post further comprises a first orientation feature.

In another aspect, the printed circuit board comprises an associated rapid insertion post assembly orientation feature.

In yet another aspect, when the first orientation feature of the rapid insertion post assembly is aligned with the associated orientation feature of the printed circuit board, the first conductive element of the rapid insertion post assembly is aligned with the first conductive segment of the segmented via, and the second conductive post element of the rapid insertion post assembly is aligned with the second conductive segment of the segmented via.

In another aspect, the semiconductor device is assembled to the rapid insertion post assembly and electrically tested prior to installation on the printed circuit board (PCB).

In yet another aspect, the rapid insertion post assembly and semiconductor device is assembled to the printed circuit board (PCB) after all thermal processing, such as soldering, high temperature baking, hot air solder leveling (HASL), or the like, have been completed, avoiding thermal stress on the semiconductor device.

In another aspect, the first conductive element vertically disposed around a first portion of the circumference of the heat sink post extends at least partially along a length of the longitudinal direction of the rapid insertion post assembly.

In another aspect, the conductive elements can extend a distance equal to a thickness of the PC board substrate. In one example, the conductive elements would extend a length of 0.092" for a standard PC Board fabricated of FR-4 (which is commonly fabricated having a thickness of 0.092").

In another aspect, the second conductive post element vertically disposed around a first portion of the circumference of the heat sink post extends only part of the way down the longitudinal direction of the heat sink post.

In yet another aspect, the second conductive post element vertically disposed around a second portion of the circumference of the heat sink post extends the complete longitudinal length of the heat sink post, and an intermediate portion of the vertical length of the second conductive is electrically isolated from the outer diameter of the heat sink post using a dielectric material.

In yet another aspect, the rapid insertion post assembly can become a heat sink post subassembly by including a third conductive member initially extending longitudinally through a central portion of an electrically isolating element and expanding outward at a distal end to a diameter consistent with a diameter provided by the first and second conductive post elements to provide electrical communication with the printed circuit board (PCB). The third conductive member would be electrically isolated from the first and second conductive post elements and would be designed to provide a thermo-mechanical connection with the thermally conductive plate provided at a bottom or far surface of the PC board for optimal heat conduction, drawing heat from the semiconductor.

In yet another aspect, the first conductive element vertically disposed around a first portion of the circumference of the heat sink post extends the complete longitudinal length of the heat sink post, and an intermediate portion of the vertical length of the first conductive is electrically isolated from the outer diameter of the heat sink post using a dielectric material.

In another aspect, the heat sink post further comprises a third conductive element vertically disposed around a third portion of the circumference of the heat sink post, and extends the complete longitudinal length of the heat sink post, and makes contact with a third conductive segment of the segmented via.

In another aspect, the third conductive element is vertically disposed through a central core section of the circumference of the heat sink post. The first and second conductive elements extends along a partial length of the post initiating at a component end of the post and terminating at a location between the component end of the post and the distal end of the post. A contacting member extends radially outward from a distal portion of the third conductive element. The first, second and third conductive elements are preferably electrically isolated from one another. The third conductive element can be fabricated of an electrically conductive material, a thermally conductive material, or a material having both electrically conductive and thermally conductive properties. A third conductive portion of the segmented via is preferably fabricated by laminating a thermally conductive plate onto the bottom or far surface of the PC board. The thermally conductive plate is preferably fabricated of aluminum or any other thermally conductive material. The thermally conductive plate can be laminated using standard prepreg, which eliminates the need for more expensive, specialized dielectrics.

In yet another aspect, the thermally conductive element of the heat sink post extends completely through the center of the heat sink post.

In another aspect, the thermally conductive element comprises additional heat dissipation elements such as fins or thermally conductive plates on the opposite side of the printed circuit board from the semiconductor device.

These and other advantages of the invention will be further understood and appreciated by those skilled in the art by reference to the following written specification, claims and appended drawings.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
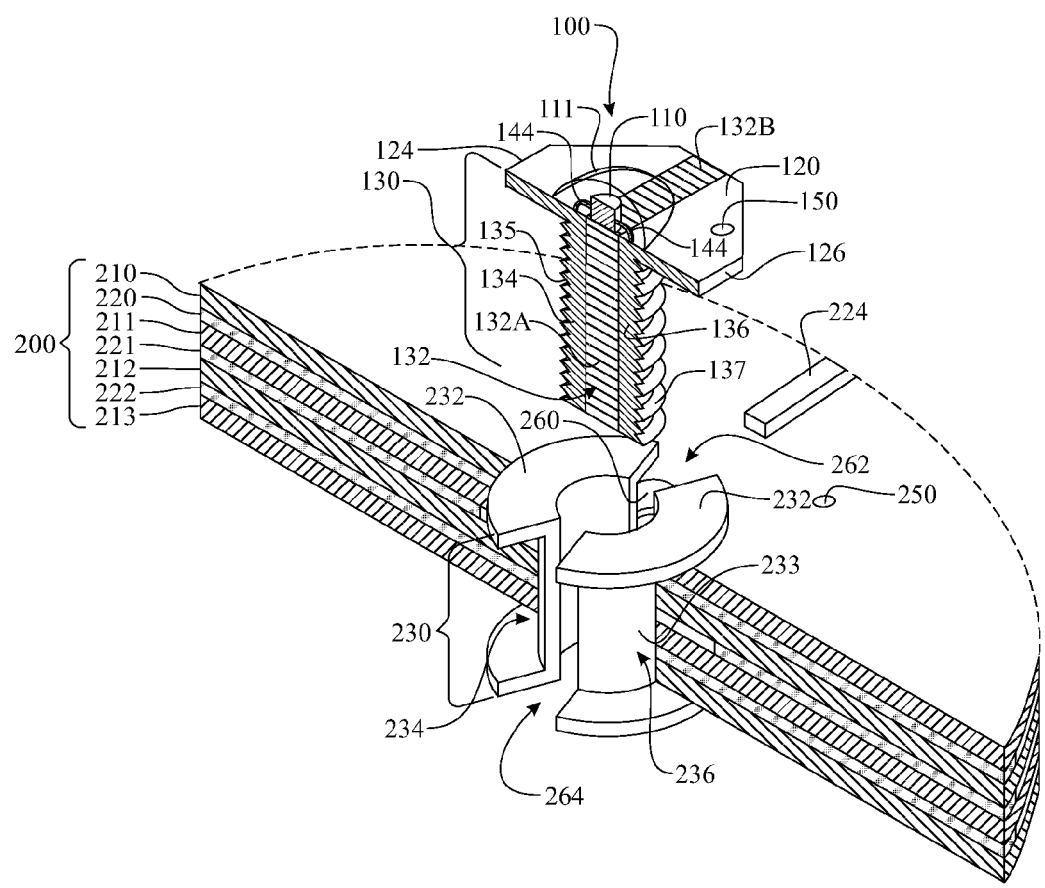
FIG. 1 presents a partially sectioned isometric view of a first exemplary rapid assembly semiconductor package being assembled into a segmented via of a printed circuit board (PCB).
Figure 2:
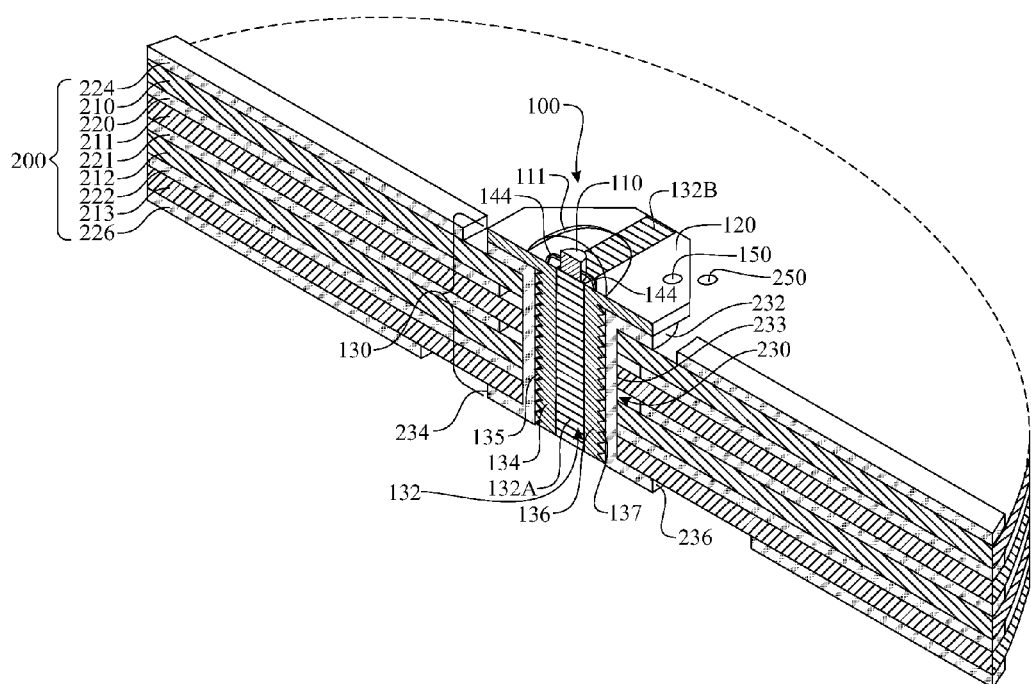
FIG. 2 presents a sectioned isometric view of the rapid assembly semiconductor package originally introduced in FIG. 1, wherein the rapid assembly semiconductor package is shown assembled within the segmented via of the PCB.
Figure 3:
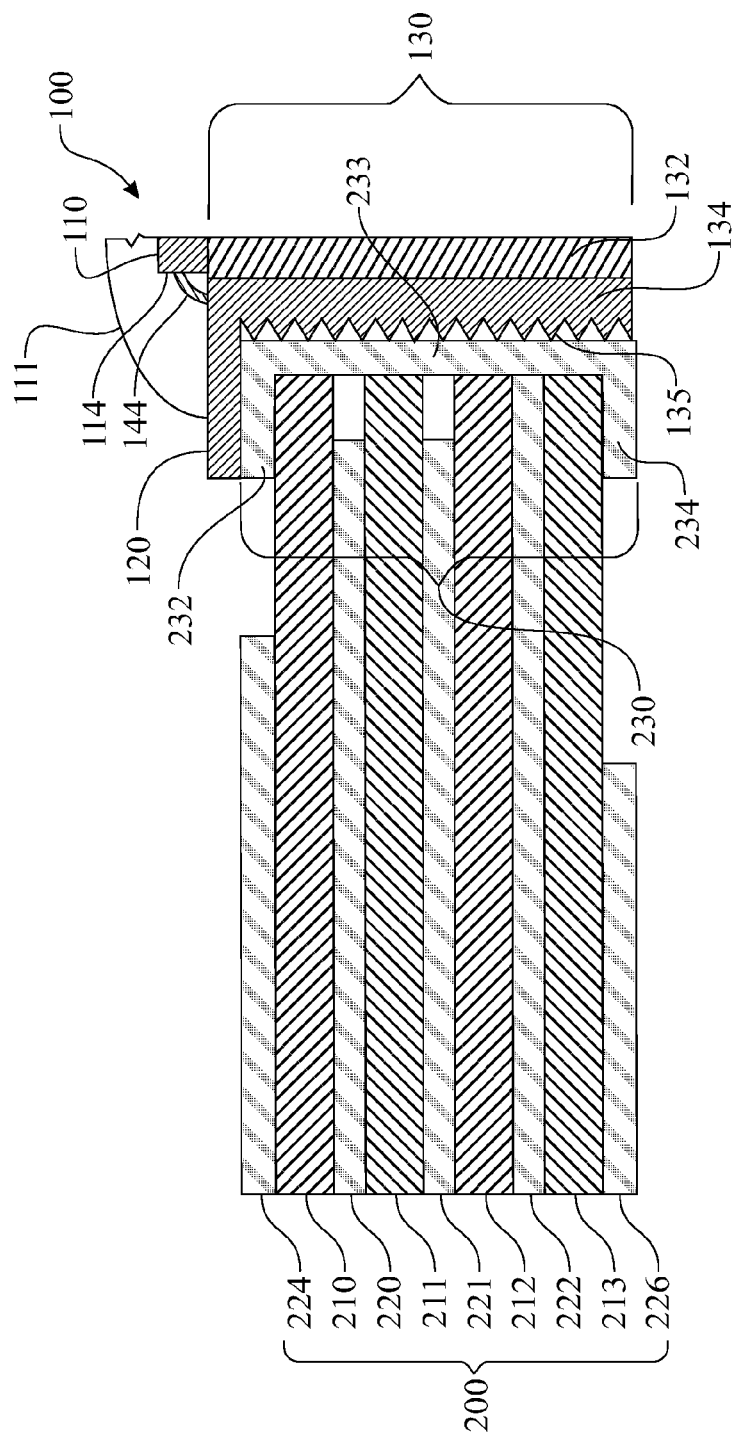
FIG. 3 presents a sectioned elevation view of the rapid assembly semiconductor package as originally introduced in FIG. 1, wherein the rapid assembly semiconductor package is shown assembled within the segmented via of the PCB.

A first exemplary embodiment, referred to as rapid assembly semiconductor package 100 is presented in the illustrations shown in FIGS. 1 through 3.

A rapid assembly semiconductor package 100 is installed into a segmented via 230 of a printed circuit board (PCB) 200, as illustrated in FIGS. 1 through 3. The segmented via 230 is segmented into two separate electrical contacts, a first electrically conductive via segment 234 and a second electrically conductive via segment 236. The rapid assembly semiconductor package 100 is fabricated having a rapid insertion post subassembly 130, which is segmented into two spaced apart separate electrical contacts, a first electrically conductive post element 134 and a second electrically conductive post element 136. When the rapid insertion post subassembly 130 is inserted into the segmented via 230, the first conductive post element 134 engages with the first conductive via segment 234 and the second conductive post element 136 engages with the second conductive via segment 236 to create each of two distinct electrical circuit components.

The rapid insertion post subassembly 130 thus comprises the first conductive post element 134 defining a first circumferential portion of the rapid insertion post subassembly 130, and the second conductive post element 136 defining a second circumferential portion of the rapid insertion post subassembly 130. The rapid insertion post subassembly 130 also comprises an electrically isolating element 132 having a longitudinal section 132A extending longitudinally through the subassembly 130 so as to fill the space between the first and second conductive post elements 134, 136 and engage with the first and second conductive post elements, thereby providing electrical isolation between the first conductive post element 134 and second conductive post element 136. A post upper flange 120 is provided at a component end of the rapid insertion post subassembly 130. The post upper flange 120 is fabricated having two spaced apart electrically conductive segments, a first electrically conductive flange segment 124 and a second electrically conductive flange segment 126. The first electrically conductive flange segment 124 is provided in electrical and mechanical communication with the first conductive post element 134. The second electrically conductive flange segment 126 is provided in electrical and mechanical communication with the second conductive post element 136. The electrically isolating element 132 also has a radial end section 132B preferably contiguous with and extending radially from an end of the longitudinal section 132A thereof. The radial end section 132B of the electrically isolating element 132 extends through the space between, and is engaged with, the first and second electrically conductive flange segments 124, 126 so as to provide mechanical support of, and electrical isolation between, the first and second electrically conductive flange segments 124, 126. The post upper flange 120 extends in an overlying relationship to the segmented via 230 so as to limit the insertion distance of the rapid insertion post subassembly 130 into the segmented via 230. The post upper flange 120 also provides a gripping interface for an insertion tool to aid in the assembly of the rapid assembly semiconductor package 100 onto the printed circuit board (PCB) 200. The post upper flange 120 provides a supporting surface for the semiconductor device 110, when applicable, and a supporting surface for supporting a lens 111. A top surface portion of the electrically isolating element 132 also provides an electrically isolating supporting surface for the semiconductor device 110.

An interchangeable electrical component, such as a semiconductor device 110, more specifically a light-emitting diode (LED), an integrate circuit, a capacitor, a resistor, and the like, is electrically connected to the respective first and second electrically conductive flange segments 124, 126 of the post upper flange 120. In the exemplary embodiment, a base portion of the semiconductor device 110 is bonded to, and thus supported upon the top surface portion of, the electrically isolating element 132. As seen in FIGS. 1 through 3, electrical communication between the semiconductor device 110 and the rapid insertion post subassembly 130 is provided by first and second electrical leads 144. A first end of the first electrical lead 144 is bonded in electrical communication to a first electrical contact 114 of the semiconductor device 110 and a second end of the first electrical lead 144 is bonded in electrical communication to the first electrically conductive flange segment 124. A first end of the second electrical lead 144 is bonded in electrical communication to a second electrical contact (similar to the first electrical contact 114) of the semiconductor device 110 and a second end of the second electrical lead 144 is bonded in electrical communication to the second electrically conductive flange segment 126. Each of the electrical leads 144 can be provided in any format, including an electrical lead, a wire bond, a soldered connection, and the like. The attachment of each of the electrical leads 144 at each end thereof can be accomplished using any known electrically conductive bonding techniques.

The rapid assembly semiconductor package 100 can optionally include the lens 111 for applications where a lens is deemed to be appropriate. The lens 111 can be transparent, translucent, clear, tinted, single-colored, multi-colored, frosted, smooth, textured, frosted, and the like. The lens 111 provides proper light dispersion and protection.

The printed circuit board (PCB) 200 is also detailed in the illustration shown in FIGS. 1 through 3. The exemplary printed circuit board (PCB) 200 includes a plurality of conductive layers 224, 220, 221, 222, and 226 in an alternating arrangement with a plurality of dielectric layers 210, 211, 212 and 213. For the purpose of this invention, the number and sequence of conductive and dielectric layers can vary widely, wherein the current structure is shown for illustrative purposes only. The printed circuit board (PCB) 200 comprises a segmented via 230 having two separate electrically conductive segments, a first conductive via segment 234 and a second conductive via segment 236. The first conductive via segment 234 makes electrical contact with one or more conductive layers 220, 221, 222, 224, and 226 of the printed circuit board (PCB) 200 as necessary to complete a first portion of an electrical circuit with the first conductor post element 134, the first flange segment 124 and the semiconductor device 110. Likewise, the second conductive via segment 236 makes electrical contact with one or more conductive layers 220, 221, 222, 224, and 226 generally creating an independent or separate second portion of the electric circuit with the second conductor post element 136, the second flange segment 126 and the semiconductor device 110.

A detailed, partially sectioned isometric view of the exemplary segmented via 230 is clearly shown in the illustration presented in FIG. 1. The segmented via 230 is fabricated having features of a commonly known via or plated-through hole, including a via annular ring 232 disposed upon each outer surface preferably concentrically located a drilled through hole and a via barrel 233 disposed upon a cylindrically shaped surface of the drilled hole spanning the length therebetween. The segmented via 230, including the via annular ring 232 and the via barrel 233, is sectioned into two electrically independent segments. The segments can be referred to as a first conductive via segment 234 and a second conductive via segment 236. In the exemplary embodiment, electrical isolation between the first conductive via segment 234 and the second conductive via segment 236 is created using a secondary drilling operation to produce a via segmenting drill aperture 260 which creates a first isolation gap 262. A similar drilling operation produces a second via segmenting drill aperture (not shown), which creates a second isolation gap 264. In another embodiment, additional isolation gaps can be created to form a segmented via having three or more conductive segments. This configuration can be fabricated as a single printed circuit board (PCB) 200, or used as a prefabricated subassembly for use to fabricate a blind via printed circuit board (PCB) 400 (FIGS. 5 and 6) or laminated printed circuit board (PCB) 600 (FIG. 7). A second exemplary process would drill the apertures 260 subsequent to a graphite application process and prior to a plating process, where the plating only adheres to the graphite deposits. It is understood that the isolation between the first conductive via segment 234 and the second conductive via segment 236 can be created by any of a variety of processes known by those skilled in the art for fabricating printed circuit boards (PCB's).

The exterior surface of the rapid insertion post subassembly 130 can be formed to aid in the insertion and/or retention of the rapid insertion post subassembly 130 within the segmented via 230. The exemplary embodiment includes a threaded surface 135, 137, wherein the threaded surface 135, 137 is formed on an exterior of the electrically isolating element 132, first conductive post element 134, and second conductive post element 136. It is understood that the exterior surface of the rapid insertion post subassembly 130 can include any electro-mechanical attachment interface, including threading, at least one clip, at least one hook, a textured surface, and the like. The assembly process would be determined by and respective to the selected exterior surface finish. In another alternative embodiment, the rapid insertion post subassembly 130 can be provided in a shape and connection form factor emulating an eyelet, a grommet, or a rivet, having a flange at each end, wherein one of the two ends expands to create a sandwich clamping force. In the exemplary embodiment, the rapid insertion post subassembly 130 is rotationally inserted into the interior of the via barrel 233. The rotational insertion mechanically and electrically engages the threads 135, 137 with the interior surface of the via barrel 233. It is understood that the engagement would be respective to the form factor of the selected electro-mechanical attachment interface.

The rapid assembly semiconductor package 100 can be provided in a thermally enhanced embodiment, wherein the electrically isolating element 132 is fabricated of a thermally conductive material. In the thermally enhanced embodiment, the electrically isolating element 132 is also thermally conductive so as to draw heat from the semiconductor device 110 and disburse the heat through the longitudinal section 132A of the thermally conductive element 132 to the first conductive post element 134 and to the second conductive post element 136 into the printed circuit board (PCB) 200. Further enhancing the thermally enhanced configuration, the semiconductor device 110 is bonded to the electrically isolating and thermally conductive element 132 using a thermally conductive bonding agent, such as a thermally conductive epoxy.

A component registration marker 150 can be provided upon the rapid assembly semiconductor package 100 at a location that remains visible during installation of the rapid assembly semiconductor package 100 into the printed circuit board (PCB) 200. A PCB registration marker 250 can be provided upon a component receiving surface of the printed circuit board (PCB) 200. The component registration marker 150 and PCB registration marker 250 can be provided in any form, format, appearance, and the like to clearly identify the marker and intentions thereof. Details of the utilization of the component registration marker 150 and PCB registration marker 250 will be provided in the details describing the insertion process of the rapid assembly semiconductor package 100 into the printed circuit board (PCB) 200.

Describing the assembly process, the technician would insert the rapid assembly semiconductor package 100 into the segmented via 230 using an insertion method associated with the selected electro-mechanical interface. The exemplary embodiment employs the rapid insertion post subassembly 130 having an exterior surface with the threaded portions 135, 137. The threaded portions 135, 137 of the rapid insertion post subassembly 130 engage with a via barrel 233 of the segmented via 230, creating thermal and electrical communications therebetween. The rapid assembly semiconductor package 100 is rotated until each component registration marker 150 is aligned with each respective PCB registration marker 250. During the insertion process, the installer would assemble the rapid assembly semiconductor package 100 to the printed circuit board (PCB) 200 in a manner to align the component registration marker 150 with the PCB registration marker 250. In the exemplary embodiment, the installer would rotate the rapid assembly semiconductor package 100 until a lower surface of the post upper flange 120 contacts a mating surface of the via annular ring 232, and continues rotating the rapid assembly semiconductor package 100 until the component registration marker 150 aligns with the PCB registration marker 250. The alignment of the component registration marker 150 with the PCB registration marker 250 ensures the first conductive post element 134 contacts the first conductive via segment 234 and the second conductive post element 136 contacts the second conductive via segment 236, while avoiding any electrical communication between the first conductive post element 134 and the second conductive via segment 236 and/or the second conductive post element 136 and the first conductive via segment 234.

When the rapid assembly semiconductor package 100 is assembled to the printed circuit board (PCB) 200, the first conductive post element 134 of the rapid insertion post subassembly 130 makes electrical contact with the first conductive via segment 234, and similarly the second conductive post element 136 of the rapid insertion post subassembly 130 makes electrical contact with the second conductive via segment 236. Similarly, each of the electrical leads 144 is employed to make an electrical connection between one of the contacts 114 on the semiconductor device 110 and a corresponding one of the first and second conductive flange segments 124, 126 of a respective one of the conductive post elements 134, 136 of the rapid insertion post subassembly 130 to complete the circuit between the rapid assembly semiconductor package 100 and the printed circuit board (PCB) 200.

Figure 4:
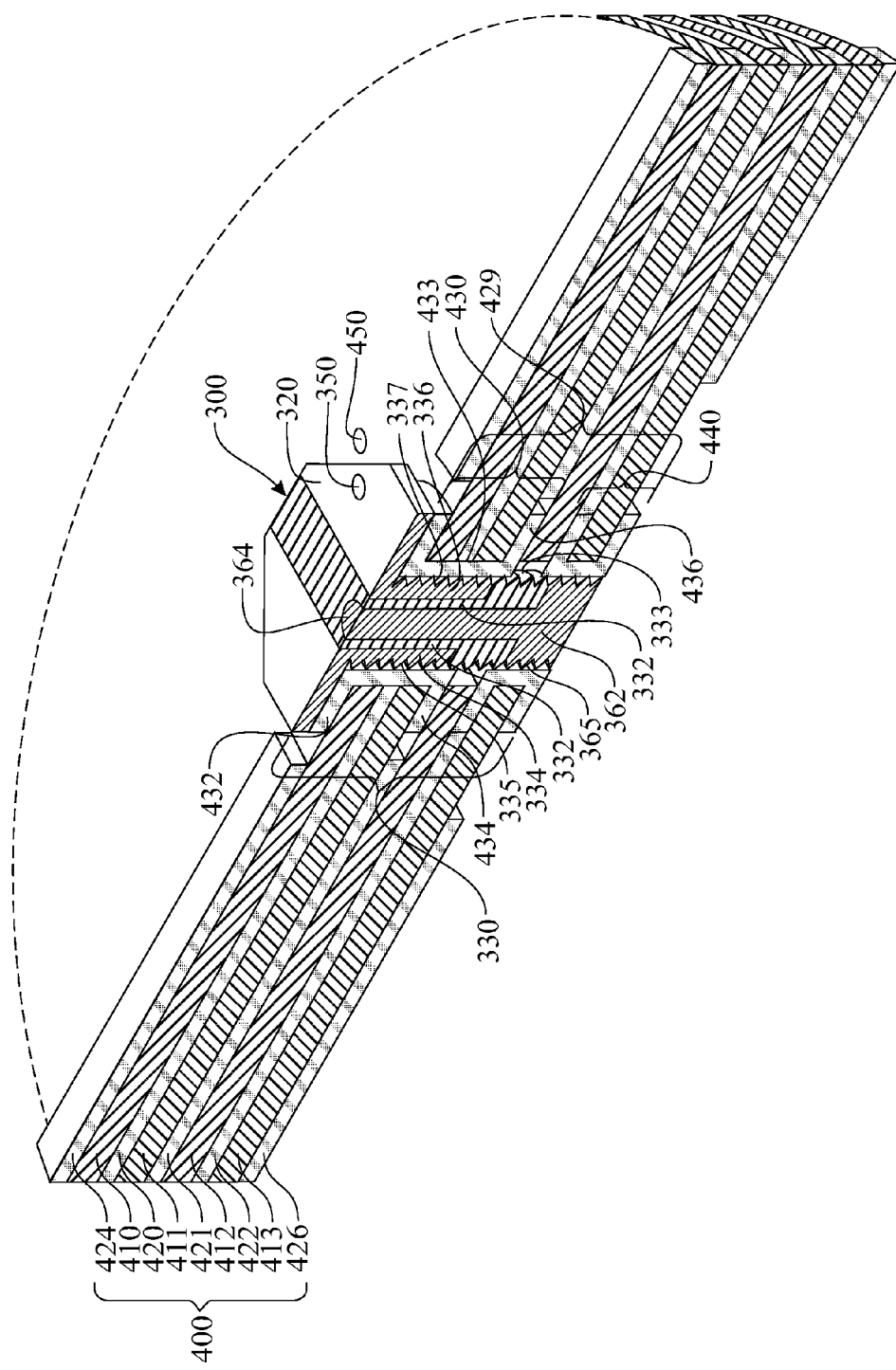
FIG. 4 presents an isometric section view of a second exemplary rapid assembly semiconductor package including a rapid assembly post comprising two electrically conductive elements and one centrally located thermally conductive element, wherein the rendering is illustrated exclusive of a semiconductor package for clarity of a component receiving portion of the post.
Figure 5:
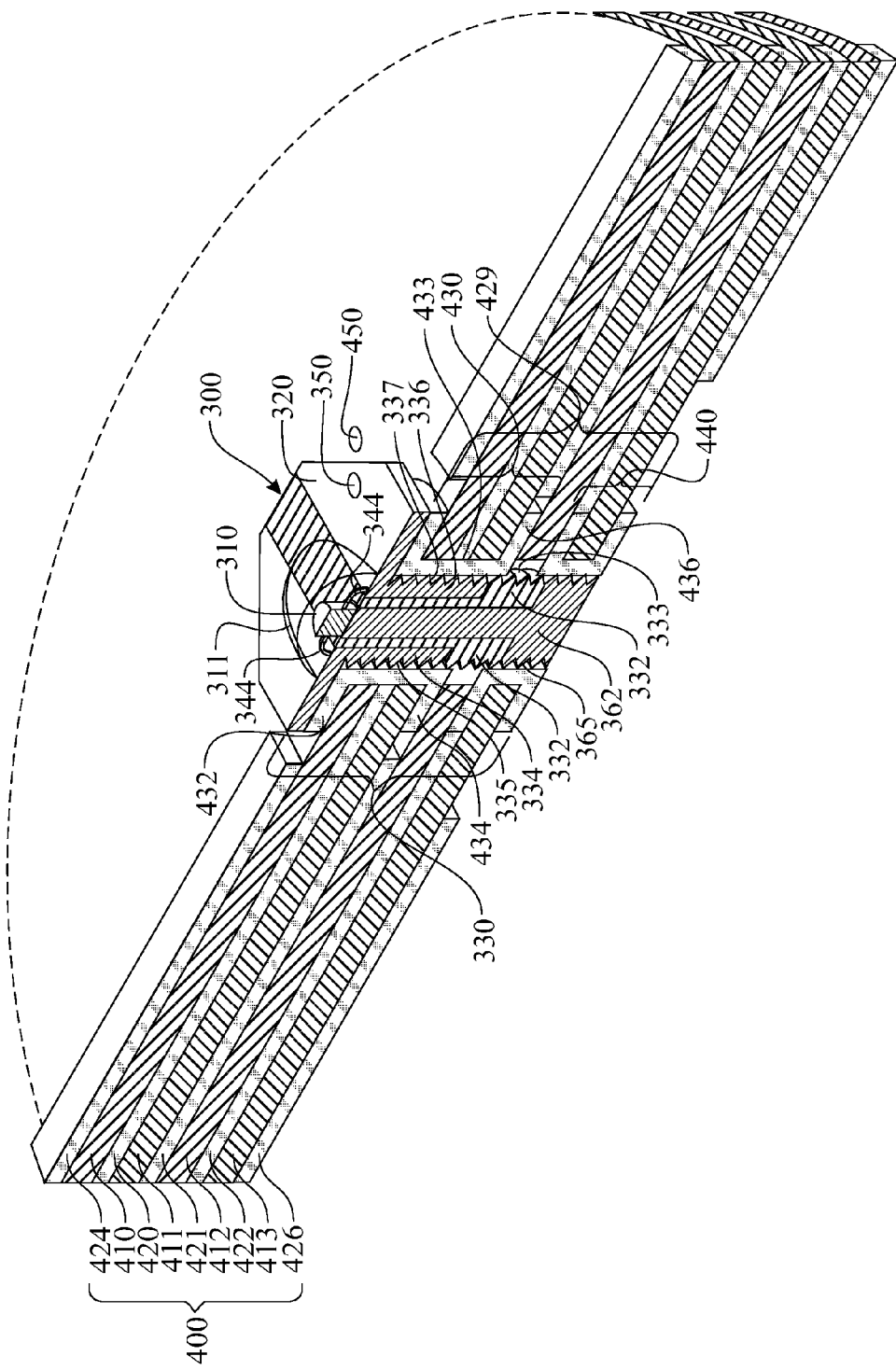
FIG. 5 presents an isometric section view of the second exemplary rapid assembly semiconductor package originally introduced in FIG. 4, wherein the rendering is illustrated inclusive of a semiconductor package.
Figure 6:
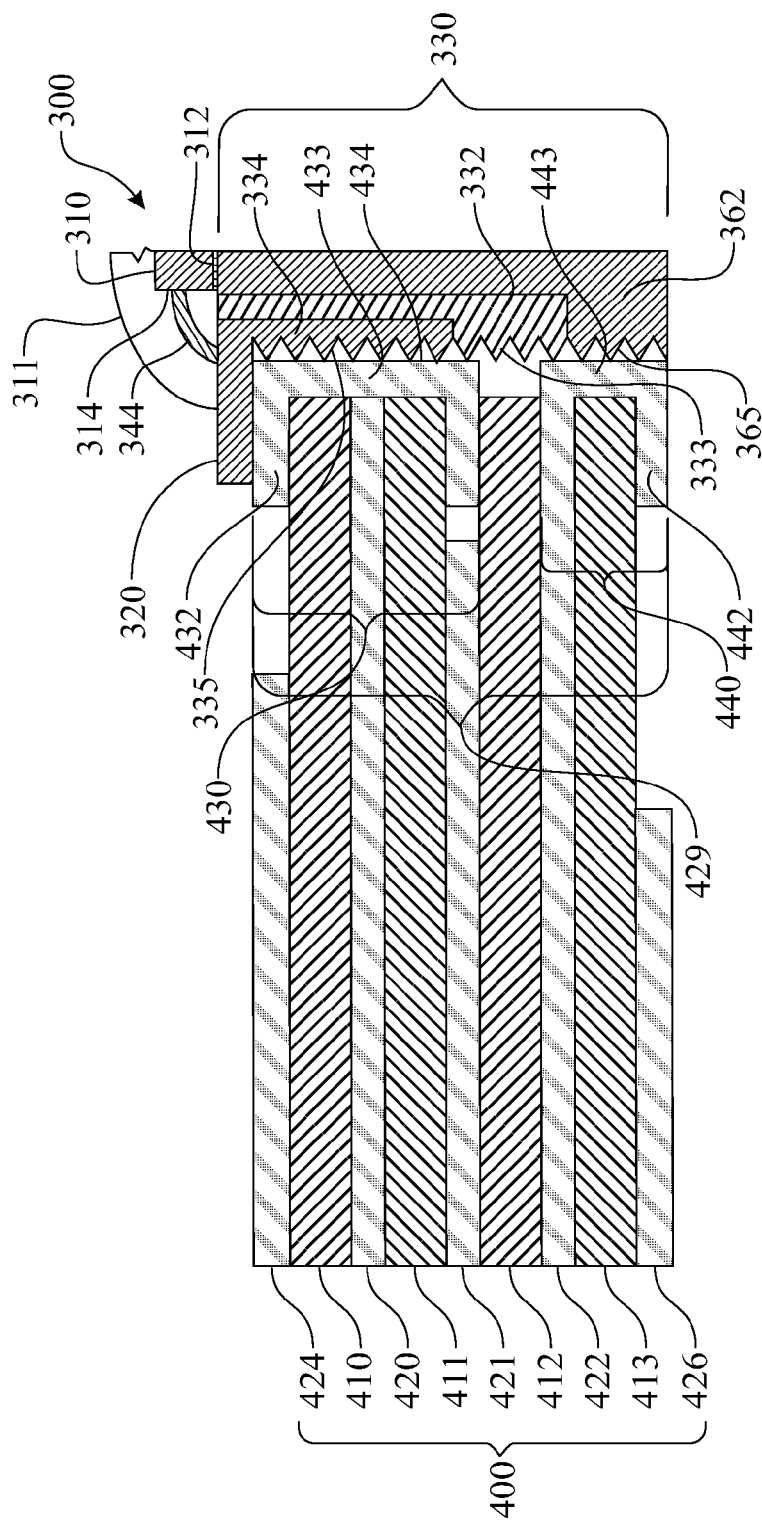
FIG. 6 presents a sectioned elevation view of the rapid assembly semiconductor package as originally introduced in FIG. 4, wherein the rapid assembly semiconductor package is shown assembled within the segmented via of the PCB.
Figure 7:
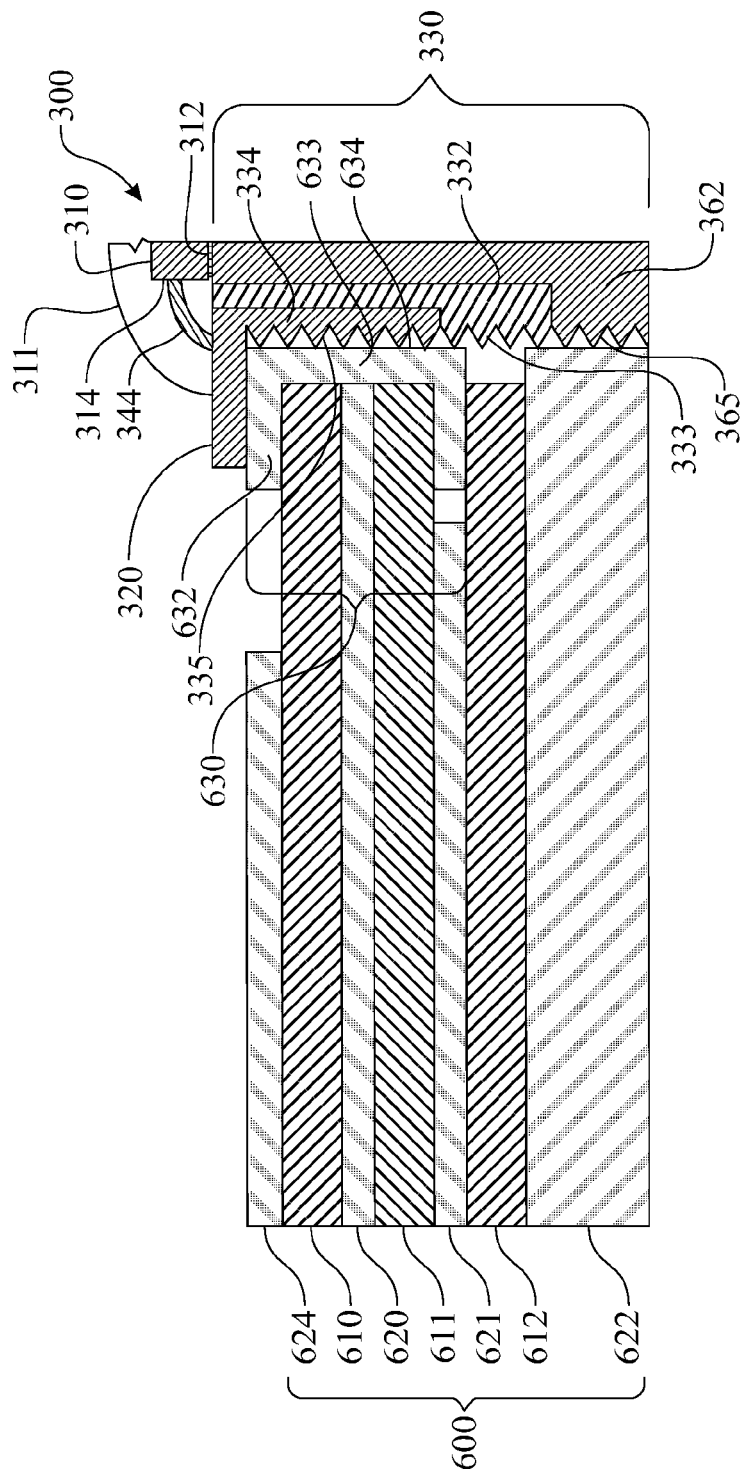
FIG. 7 presents a sectioned elevation view of the rapid assembly semiconductor package as originally introduced in FIG. 4, wherein the rapid assembly semiconductor package is shown assembled within the segmented via of an alternatively configured PCB.

A second exemplary embodiment, referred to as a semiconductor device heat sink post assembly 300, is presented in the illustrations shown in FIGS. 4 through 6. The semiconductor device heat sink post assembly 300 includes a majority of like features of the rapid assembly semiconductor package 100. The printed circuit board (PCB) 400 includes a majority of like features of the printed circuit board (PCB) 200. Like features of the semiconductor device heat sink post assembly 300 and the rapid assembly semiconductor package 100 are numbered the same except preceded by the numeral '3'. Similarly, like features of the printed circuit board (PCB) 400 and the printed circuit board (PCB) 200 are numbered the same except preceded by the numeral '4'.

The heat sinking rapid assembly semiconductor package 300 is an enhanced version of the rapid assembly semiconductor package 100, introducing a central conductive element 362. The central conductive element 362 comprises a central elongated segment extending generally perpendicular from a post upper flange 320 and is centrally located passing through an electrically isolating element 332. The electrically isolating element 332 provides electrical isolation between the first conductive post element 334, a second conductive post element 336, and a central conductive element 362. A central post electrical contact 364 is formed at a component end of the central conductive element 362. A base contact of the semiconductor device 310 is thermally coupled to the central post electrical contact 364, preferably using a thermally conductive material, such as thermally conductive epoxy or a similar thermally conductive bonding agent 312. A broadened threaded central conductive distal section 365 is provided at a distal end of the central conductive element 362. Each of the first conductive post element 334, the second conductive post element 336, and the central conductive element 362 extend generally perpendicular from a contacting surface of the post upper flange 320, terminating at a location short of a length of the heat sink post subassembly 330. The electrically isolating element 332 comprises a broadened threaded distal section 333 initiating at a distal end of the conductive post elements 334, 336 and continuing to a proximal end of a broadened threaded central conductive distal section 365. The broadened threaded central conductive distal section 365 continues from the distal end of the broadened distal section 333 and terminates at a distal end of the heat sink post subassembly 330. The central conductive element 362 is preferably fabricated of an electrically and/or thermally conductive material.

The printed circuit board (PCB) 400 includes a composite via 429, wherein the composite via 429 includes a segmented via 430 (also referred to as a first or upper via 430) and a secondary via 440 (also referred to as a secondary via 440). The segmented via 430 includes features common to a via, including a via annular ring 432 disposed upon each outer surface of one or more respective layers of the PCB 400, wherein annular rings 432 are preferably concentrically located about a drilled through hole and a via barrel 433 disposed upon a surface of the drilled hole spanning the length therebetween. The segmented via 430 is sectioned into a first conductive via segment 434 and a second conductive via segment 436. The sectioning can be accomplished using processes previously described. The secondary via 440 can be either a standard plated through hole (as illustrated) or a segmented plated-through hole. The secondary via 440 includes features common to a via, including a via annular ring 442 disposed upon each outer surface of a respective layer of the printed circuit board (PCB) 400, wherein annular rings 442 are preferably concentrically located about a drilled through hole and a via barrel 443 disposed upon a surface of the drilled hole spanning the length therebetween. The printed circuit board (PCB) 400 would be fabricated using any standard multi-via lamination technology, wherein the layers of the printed circuit board (PCB) 400 are fabricated independently, then laminated together in accordance with the desired via structure. The broadened central conductive engaging distal section 365 extends radially about a distal end of the central conductive element 362 to engage with the via barrel 443 of the secondary via 440.

The secondary via 440 can be coupled with an internal conductive layer 422, where the internal conductive layer 422 and/or an external conductive layer 426, wherein the internal conductive layer 422 and/or an external conductive layer 426 is designed to provide electrical communication and/or thermal dissipation from the central conductive element 362. The heat sinking rapid assembly semiconductor package 300 enables increased thermal dissipation and/or additional electrical communication with the semiconductor device 310 compared to the rapid assembly semiconductor package 100.

The assembly process is similar to that of the rapid assembly semiconductor package 100, where the technician would install and secured the heat sinking rapid assembly semiconductor package 300 into the plated-through hole comprising the first via conductive via segments 434, 436, continuing into the second via or plated-through hole 440. The threaded portions 335, 337 of the heat sink post subassembly 330 engage with a first via barrel section 433 of the first via or plated-through hole 430, creating thermal and electrical communications therebetween. The broadened central conductive engaging distal section 365 engages with the via barrel 443 of the secondary via 440. The rapid assembly semiconductor package 300 would be rotated until the contacting surface of the post upper flange 320 contacts the exposed surface of the first via annular ring 432, then continues to be rotated until at least one component registration marker 150 is aligned with each respective PCB registration marker 250.

When the heat sinking rapid assembly semiconductor package 300 is assembled to the printed circuit board (PCB) 400, the first conductive post element 334 of the heat sink post subassembly 330 makes electrical contact with the first conductive via segment 434, and similarly the second conductive post element 336 of the heat sink post subassembly 330 makes electrical contact with the second conductive via segment 436. An electrical lead 344 is employed to provide an electrical connection between a first lead 314 on the semiconductor device 310 and the first conductive post element 334 of the heat sink post subassembly 330. Similarly, a second electrical lead 344 is employed to make electrical connection between a second lead (similar to the first lead 314) on the semiconductor device 310 and the second conductive post element 336 of the heat sink post subassembly 330 to complete the circuit between the printed circuit board 400 and the heat sink post subassembly 330.

A third exemplary embodiment, as presented in the illustrations shown in FIG. 7, utilizes the same semiconductor device heat sink post assembly 300, wherein the semiconductor device heat sink post assembly 300 is assembled to a printed circuit board (PCB) 600. The printed circuit board (PCB) 600 includes a majority of like features of the printed circuit board (PCB) 400. Similarly, like features of the printed circuit board (PCB) 600 and the printed circuit board (PCB) 400 are numbered the same except preceded by the numeral '6'. The difference between the printed circuit board (PCB) 600 and the printed circuit board (PCB) 400 is the inclusion of a base thermal layer, wherein the printed circuit board (PCB) 400 utilizes a conductive layer combined with a plated hole 630, the printed circuit board (PCB) 600 additionally includes a thermally conductive plate 622 laminated to the bottom or far side of the base substrate 612 of the printed circuit board (PCB) 600. The thermally conductive plate 622 would be fabricated having thickness that is suitable for engaging with the broadened threaded central conductive distal section 365, while avoiding electrical communication with the first conductive element external threads 335, 337. The thermally conductive plate 622 can be used to absorb thermal energy from the heat sinking rapid assembly semiconductor package 300 and/or provide electrical communication thereto.

A fourth exemplary embodiment, referred to as a heat sinking rapid assembly semiconductor package 500, is presented in the illustrations shown in FIGS. 8 through 12. The heat sinking rapid assembly semiconductor package 500 includes many like features of the rapid assembly conductor package 100 and the heat sinking rapid assembly semiconductor package 300. The printed circuit board (PCB) 700 includes many like features of the printed circuit board (200) and the printed circuit board (PCB) 400. Like features of the heat sinking rapid assembly semiconductor package 500 and the rapid assembly conductor package 100 and the heat sinking rapid assembly semiconductor package 300 are numbered the same except preceded by the numeral '5,' unless otherwise indicated. Similarly, like features of the printed circuit board (PCB) 700 and the printed circuit board (PCB) 400 and the printed circuit board (PCB) 200 are numbered the same except preceded by the numeral '7,' unless otherwise indicated.

The heat sinking rapid assembly semiconductor package 500 is an alternative implementation of the rapid assembly conductor package 100 and the heat sinking rapid assembly semiconductor package 300, illustrating an alternative attachment interface, namely a hook attachment interface.

Figure 8:
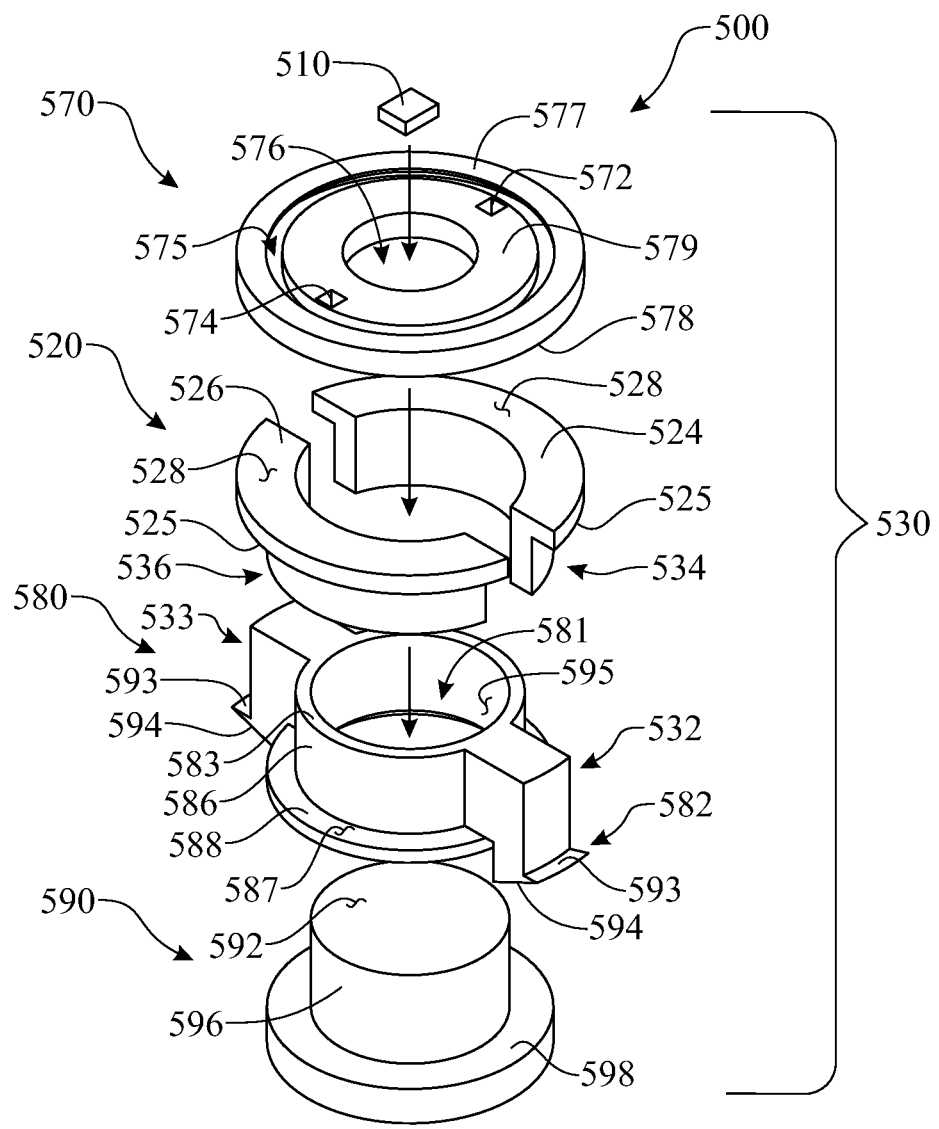
FIG. 8 presents an exploded isometric view of another exemplary rapid assembly semiconductor package, without a lens element.

Referring initially to FIG. 8, the heat sinking rapid assembly semiconductor package 500 is presented in an exploded isometric view. The heat sinking rapid assembly semiconductor package 500 comprises a lens element 511 (FIGS. 9 and 10), a semiconductor device 510, and a rapid insertion post subassembly 530. The rapid insertion post subassembly 530 includes a nonconductive lens support element 570, a pair of conductive post elements 534, 536, electrically isolated by an electrically isolating body 580, and a thermally conductive element 590 centrally disposed within the electrically isolating body 580, the thermally conductive element 590 concentric with each of the nonconductive lens support element 570 and electrically isolating body 580.

The nonconductive lens support element 570 includes a circular channel 575 defined by a pair of concentric sidewalls 577, 579 of the nonconductive lens support element 570. The circular channel 575 is configured to engage a bottom peripheral edge of the lens element 511 (FIGS. 9 and 10), securing the lens element to the rapid insertion post subassembly 530, thereby enclosing the semiconductor device 510 within the rapid insertion post subassembly 530. The nonconductive lens support element 570 further includes a pair of through holes 572, 574 disposed on opposing sides of an inner one 579 of the pair of concentric sidewalls 577, 579. The through holes 572, 574 define a pair of openings, each opening for receiving an electrical lead wire therethrough bonded to one of the pair of conductive post elements 534, 536 at one end and bonded to the semiconductor device 510 at an opposing end, as explained in more detail below.

The rapid insertion post subassembly 530 further includes two separate electrical contacts, the first conductive post element 534 and the second conductive post element 536. The first conductive post element 534 defines a first circumferential portion of the rapid insertion post subassembly 530 and the second conductive post element 536 defines a second circumferential portion of the rapid insertion post subassembly 530. A post upper flange 520 is provided at a component end of the rapid insertion post subassembly 530. The post upper flange 520 is fabricated having two electrically conductive segments, a first electrically conductive flange segment 524 and a second electrically conductive flange segment 526. The first electrically conductive flange segment 524 is provided in electrical and mechanical communication with the first conductive post element 534. The second electrically conductive flange segment 526 is provided in electrical and mechanical communication with the second conductive post element 536.

Figure 12:
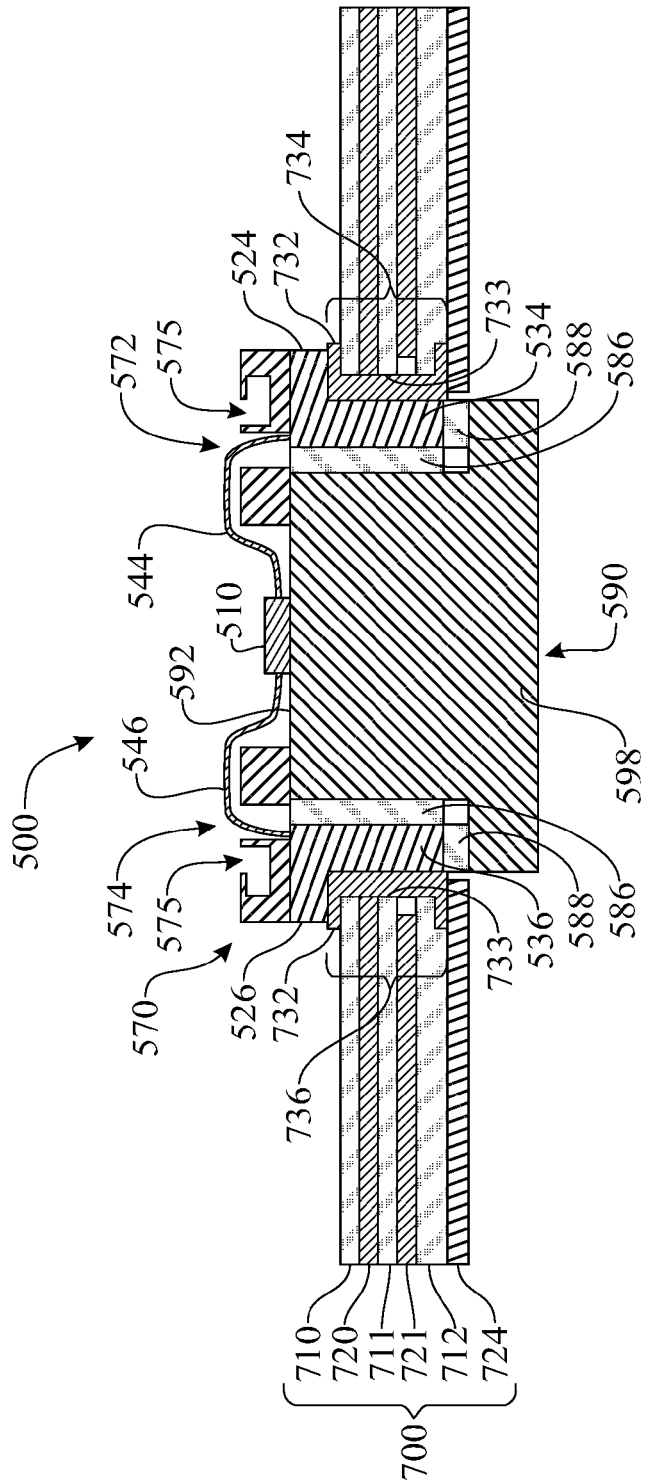
FIG. 12 presents a sectioned elevation view of the rapid assembly semiconductor package originally introduced in FIG. 8, taken along line 12-12 in FIG. 10, wherein the rapid assembly semiconductor package is shown assembled within the segmented via of the PCB, illustrating attachment of electrical leads to an LED die and electrically conductive LED segments.

The electrically isolating body 580 is fabricated to be centrally disposed within a cylindrical opening defined by the pair of conductive post elements 534, 536. The electrically isolating body 580 includes an electrically isolating cylindrical main body sidewall 586 and an electrically isolating cylindrical body bottom ledge 588 affixed to a bottom edge of the main body sidewall 586. The electrically isolating body 580 further includes a pair of extended sidewalls 532, 533, extending outwardly from opposing sides of the outer surface of the cylindrical main body sidewall 586, and further extending downwardly below the bottom ledge 588. The pair of extended sidewalls 533, 532 provide electrical isolation between the first conductive post element 534 and the second conductive post element 536, when the heat sinking rapid assembly semiconductor package 500 is assembled, as best illustrated in FIG. 12. Additionally, the pair of extended sidewalls 533, 532 prevents rotation of the heat sinking rapid assembly semiconductor package 500, once inserted into the PCB 700.

A pair of hook elements 582 are affixed, each to the bottom edge of the respective extended sidewall 532, 533. Each of the pair of hook elements 582 includes an elongated body 594 that is tapered outwardly towards a tapered end 593, the tapered end 593 extending beyond the exterior surface of the extended sidewalls 532, 533. The hook elements 582 are flexible and resilient in order compress while slideably passing through the isolation gaps 762, 764 (FIGS. 9 and 10), during installation, and then automatically recoil or spring back, when the hook elements 582 extend below a bottom surface of the PCB 700 (FIG. 11), after installation into the PCB 700. The hook elements 582 can be fabricated to be integral with the extended sidewalls 532, 533.

Furthermore, although the electrically isolating body 580 and the nonconductive lens support element 570 are shown as separate components, it is understood that the electrically isolating body 580 and the lens support element 570 can be formed as an integral unitary body, by, for example, injection molding around the conductive post elements 534, 536. Accordingly, the electrically isolating body 580 and the lens support element 570 can be fabricated of the same nonconductive material, such as, for example, a plastic polymer material, or any other nonconductive material well-known in the art.

The thermally conductive element 590, also referred to as a "heat sink slug," includes a thermally conductive cylindrical main body 596, sized and configured to be housed within a cylindrical cavity 581 defined by the cylindrical main body sidewall 586 of the electrically isolating body 580. The thermally conductive element 590 further includes a thermally conductive element bottom ledge 598 extending about a circumferential perimeter of a bottom circumferential edge of the thermally conductive cylindrical main body 596.

When components of the heat sinking rapid assembly semiconductor package 500, such as the components depicted in the exploded view presented in FIG. 8, are assembled, formed, and/or fabricated together, a bottom surface 578 of the lens support element 570 engages a top surface 528 of the post upper flange 520. An upper rim 583 of the electrically isolating cylindrical main body sidewall 586 engages a bottom surface 525 of the post upper flange 520, while the conductive post elements 534, 536, defining upright conductive sidewalls, engage an interior surface 595 of the electrically isolating cylindrical main body sidewall 586. A bottom edge of the conductive post elements 534, 536 engages and rests upon a top surface 587 of the electrically isolating cylindrical body bottom ledge 588. The thermally conductive cylindrical main body 596 is disposed within the cylindrical cavity 581 such that a top surface 592 of the thermally conductive cylindrical main body 596 is flush with the upper rim 583 of the electrically isolating body 590. Finally, the semiconductor device 510 is mounted on the top surface 592 of the thermally conductive cylindrical main body 596. The thermally conductive element 590 operates as a heat sink, drawing heat from the semiconductor device 510. Electro-mechanical integration of the electrical leads is discussed below, with reference to FIG. 12.

Figure 9:
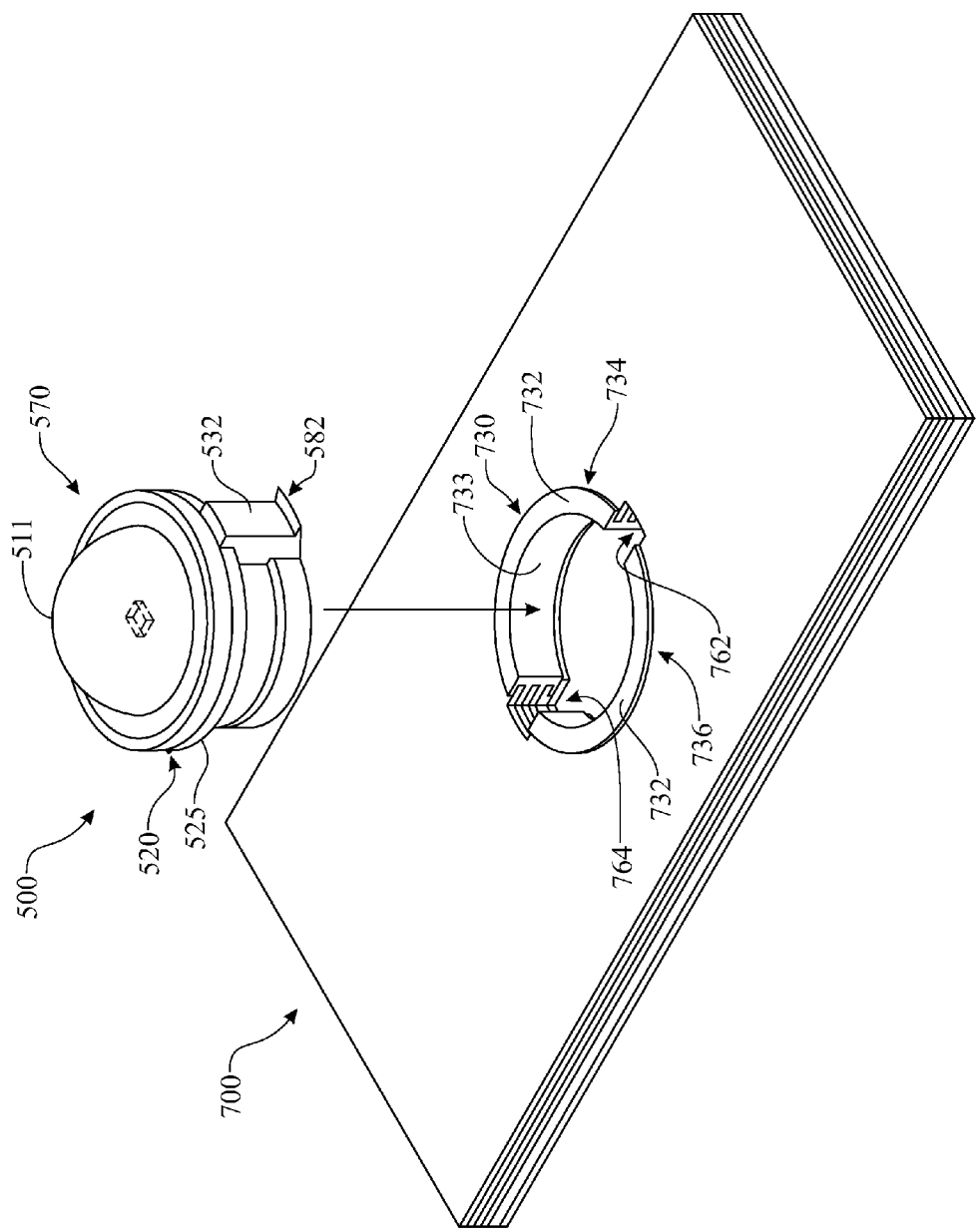
FIG. 9 presents an isometric view of the rapid assembly semiconductor package originally introduced in FIG. 8, wherein the rapid assembly semiconductor package is shown prior to insertion within a segmented via of a PCB.
Figure 10:
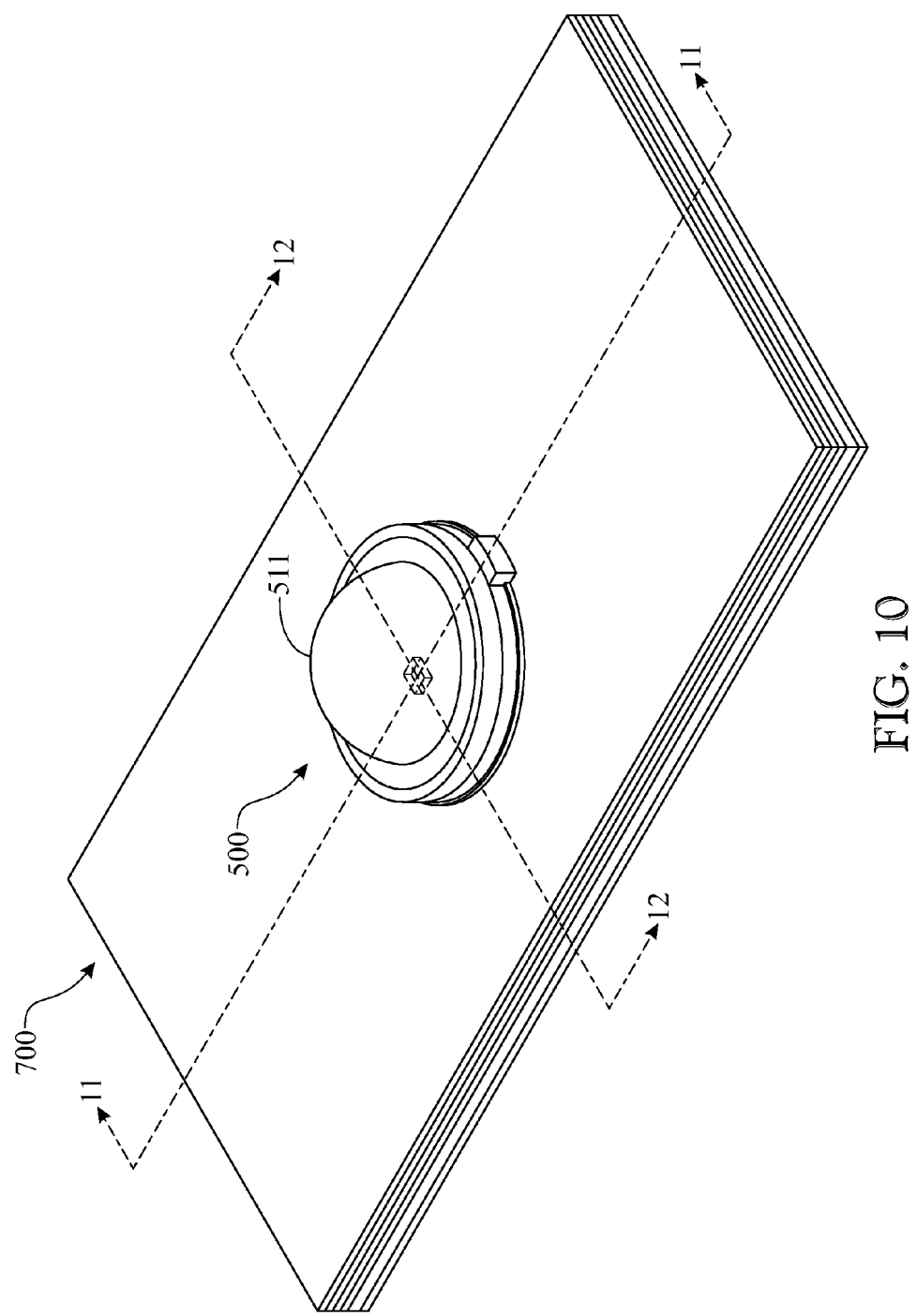
FIG. 10 presents an isometric view of the rapid assembly semiconductor package originally introduced in FIG. 8, wherein the rapid assembly semiconductor package is shown inserted within the segmented via of the PCB.

Referring now primarily to FIGS. 9 and 10, rapid installation of the heating sinking rapid assembly semiconductor package 500 (as assembled) is illustrated. The lens element 511 is shown engaged within the lens support element 570. And the extended sidewall 532 is shown with the integral hook element 582 extending therefrom.

The PCB 700 includes a conductive segmented via 730 disposed upon each outer surface preferably concentrically located within a drilled through hole and a via barrel 733 disposed upon a cylindrically shaped surface of the drilled hole spanning the length therebetween. The segmented via 730, including the via annular ring 732 and the via barrel 733, is sectioned into two electrically independent segments. The segments can be referred to as a first conductive via segment 734 and a second conductive via segment 736, similar to the conductive via segments 234, 236 discussed above, which are well-known in the art. Also, as discussed above, the drilled through hole additionally includes a first 762 and a second isolation gap 764 to provide electrical isolation between the first and second conductive via segments 734, 736. When installed the extended sidewalls 532, 533 are slideably and fittingly received within the corresponding isolation gaps 762, 764. The bottom surface 525 of the post upper flange 520 engages a top surface of the via angular ring 732.

Figure 11:
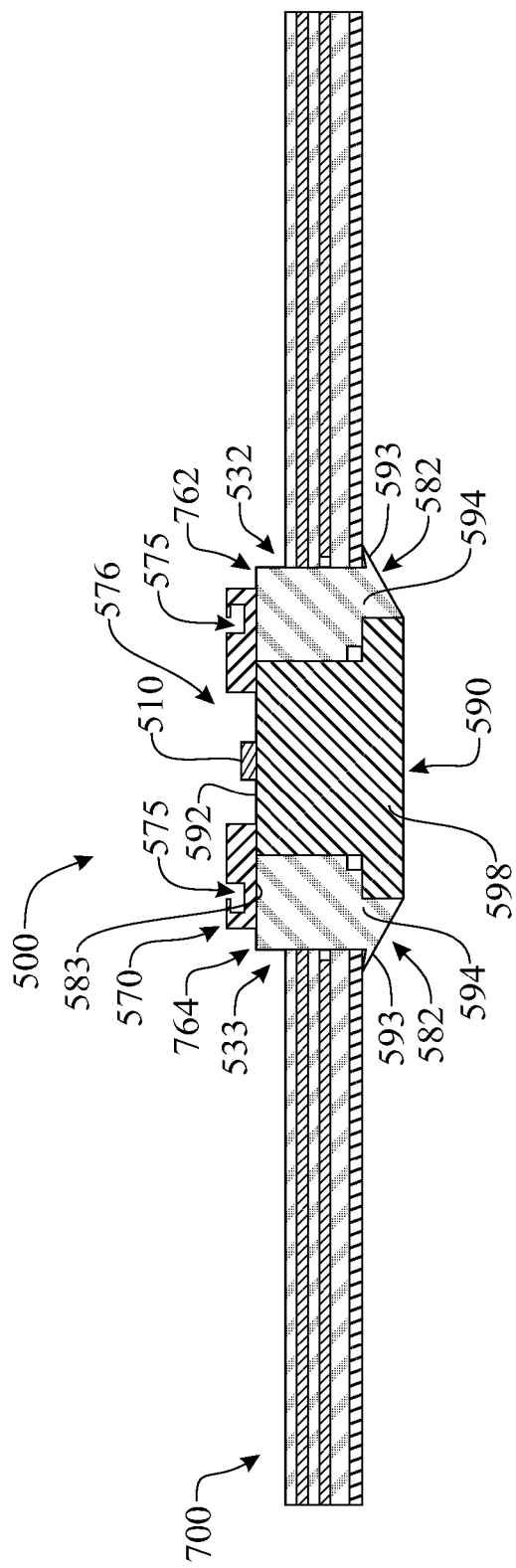
FIG. 11 presents a sectioned elevation view of the rapid assembly semiconductor package originally introduced in FIG. 8, taken along line 11-11 in FIG. 10, wherein the rapid assembly semiconductor package is shown assembled, within the segmented via of the PCB, illustrating the hook elements.

Referring now primarily to FIG. 11, a sectional view is illustrated taken along sectional line 11-11 of FIG. 10, showing placement of the hook elements 582 within the PCB 700. An upper surface of the tapered end 593 of the hook element 582 extends below and engages the bottom surface of the PCB 700. The combination of the post upper flange 520 and the resilient hook elements 582 operably secures the heat sinking rapid assembly semiconductor package 500 within the PCB 700. The resilient hook elements 582 prevent upward movement of the semiconductor package 500, while the post upper flange 520, resting on the via angular ring 732, prevents downward movement of the semiconductor package 500.

The electrically isolating extended sidewalls 532, 533 are shown, within the respective isolation gaps 762, 764, engaging layers of the PCB 700. The semiconductor device 510 is shown mounted onto the top surface 592 of the thermally conductive element 590 within an aperture 576 of the thermally conductive element 590. The lens support element 570 is shown engaging the upper rim 583 of the electrically isolating body 580 and also engaging the top surface 592 of the thermally conductive element 590.

Referring now primarily to FIG. 12, a sectional view is illustrated taken along sectional line 12-12 of FIG. 10, showing the electrical leads 544, 546 and the resulting electrical circuit of the heating sinking rapid assembly semiconductor package 500 installed within the PCB 700.

The PCB 700 includes a plurality of conductive layers 720, 721, and 724 in an alternating arrangement with a plurality of dielectric layers 710, 711, and 712 is illustrated. It is understood that while the exemplary PCB 700 is a multi-layer PCB, a single layer PCB can be used with the heating sinking rapid assembly semiconductor package 500.

As with the rapid assembly semiconductor package 100 and 300, the first conductive post element 534 makes electrical contact with the first conductive via segment 743, and similarly, the second conductive post element 536 makes electrical contact with the second conductive via segment 736. Similarly, each of the electrical leads 544, 546 is employed to make an electrical connection between a lead on the semiconductor device 510 and a respective conductive post element 534, 536 of the rapid insertion post subassembly 530 to complete the circuit between the rapid assembly semiconductor package 500 and the printed circuit board (PCB) 700. The electrically isolating cylindrical main body sidewall 586 and bottom ledge 588 provides electrical and/or thermal isolation between the conductive post elements 534, 536 and the thermally conductive element 590.

Electrical communication between the semiconductor device 510 and the rapid insertion post subassembly 530 is provided by a pair of electrical lead 544, 546. A first end of a first electrical lead 544 is bonded in electrical communication to a first electrical contact of the semiconductor device 510 and a second end of the first electrical lead 544 is bonded in electrical communication to the first electrically conductive flange segment 524. A length of the electrical lead 544 passes through the first through-hole 572 of the lens support element 570, facilitating electro-mechanical communication between the electrically conductive flange segment 524 and the semiconductor device 510. A first end of a second electrical lead 546 is bonded in electrical communication to a second electrical contact of the semiconductor device 510 and a second end of the second electrical lead 546 is bonded in electrical communication to the second electrically conductive flange segment 526. A length of the electrical lead 546 passes through the second through-hole 574 of the lens support element 570, facilitating electro-mechanical communication between the electrically conductive flange segment 526 and the semiconductor device 510.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What I claim is:

1. A rapid assembly semiconductor package comprising:
   a semiconductor device having a first electrical lead and a second electrical lead; and
   a rapid insertion post subassembly comprising
   a first electrically conductive post element disposed along and forming a first longitudinal portion of a circumference of said rapid insertion post subassembly, said first electrically conductive post element including a first mechanical attachment interface disposed thereon being mechanically and electrically engaged with a first electrically conductive portion of a printed circuit board,
   a first electrically conductive end segment provided in electrical and mechanical communication with an upper end of said first electrically conductive post element and said first electrical lead of said semiconductor device,
   a second electrically conductive post element disposed along and forming a second longitudinal portion of said circumference of said rapid insertion post subassembly, said second electrically conductive post element including a second mechanical attachment interface disposed thereon being mechanically and electrically engaged with a second electrically conductive portion of the printed circuit board, said first and second electrically conductive post elements being spaced apart,
   a second electrically conductive end segment provided in electrical and mechanical communication with an upper end of said second electrically conductive post element and said second electrical lead of said semiconductor device, said first and second electrically conductive segments being spaced apart, and
   an electrically isolating element comprising
      a longitudinal section extending longitudinally along a center of said rapid insertion post subassembly through the space between, and being engaged with, said first and second electrically conductive post elements so as to provide electrical isolation of said first and second electrically conductive post elements from one another,
      an end section extending through the space between, and being engaged with, said first and second electrically conductive end segments so as to provide electrical isolation of said first and second electrically conductive end segments from one another and mechanical support of said first and second electrically conductive end segments, and
      a top surface portion providing an electrically isolating supporting surface carrying said semiconductor device such that a first portion of an electrical circuit including said semiconductor device is provided from said semiconductor device through said first electrically conductive end segment and post element to the first electrically conductive portion of the printed circuit board and a second portion of the electrical circuit being separate from said first portion is provided from said semiconductor device through said second electrically conductive end segment and post element to the second electrically conductive portion of the printed circuit board.

2. The rapid assembly semiconductor package as recited in claim 1, wherein:
   said semiconductor device further has a first electrical contact and a second electrical contact;
   said first electrical lead of said semiconductor device comprises a first wire bond between said first electrically conductive end segment and said first electrical contact of said semiconductor device so as to provide said electrical communication therebetween; and said second electrical lead of said semiconductor device comprises a second wire bond between said second electrically conductive end segment and said second electrical contact of said semiconductor device so as to provide said electrical communication therebetween.

3. The rapid assembly semiconductor package as recited in claim 1, being assembled with the printed circuit board, comprising:
a first printed circuit board circuit; and
a second printed circuit board circuit being separate from said first printed circuit board circuit;
wherein said first electrically conductive end segment and post element provide electrical communication between said first electrical lead of said semiconductor device and said first printed circuit board circuit; and
wherein said second electrically conductive end segment and post element provide electrical communication between said second electrical lead of said semiconductor device and said second printed circuit board circuit.

4. The rapid assembly semiconductor package as recited in claim 1, further comprising a registration marker on said semiconductor device providing an orientation identifier being visible when viewing said rapid assembly semiconductor package from a semiconductor carrying side thereof so as to indicate the orientation of said rapid assembly semiconductor package relative to that of the printed circuit board.

5. The rapid assembly semiconductor package as recited in claim 1, being assembled with a printed circuit board including at least one plated-through hole having said respective first and second electrically conductive portions being sized to mechanically accept and engage with said mechanical attachment interfaces of said first electrically conductive post element and said second electrically conductive post element.

6. The rapid assembly semiconductor package as recited in claim 1, being assembled with a printed circuit board including at least one segmented plated-through hole comprising a first electrically conductive via segment and a second electrically conductive via segment being electrically isolated from one another and having said respective first and second electrically conductive portions being sized to mechanically accept and engage with said mechanical attachment interfaces of said first electrically conductive post element and said second electrically conductive post element.

7. The rapid assembly semiconductor package as recited in claim 1, wherein said semiconductor device is a light emitting diode.

8. A heat sinking rapid assembly semiconductor package, comprising:
a semiconductor device having a first electrical lead and a second electrical lead, said semiconductor device also having a base portion; and
a heat sink post subassembly comprising
a first electrically conductive post element disposed along and forming a first longitudinal portion of a circumference of said heat sink post subassembly, said first electrically conductive post element including a first mechanical attachment interface disposed thereon being mechanically and electrically engaged with a first electrically conductive portion of a printed circuit board,
a first electrically conductive end segment provided in electrical and mechanical communication with an upper end of said first electrically conductive post element and said first electrical lead of said semiconductor device,
a second electrically conductive post element disposed along and forming a second longitudinal portion of said circumference of said heat sink post subassembly, said second electrically conductive post element including a second mechanical attachment interface disposed thereon being mechanically and electrically engaged with a second electrically conductive portion of the printed circuit board, said first and second electrically conductive post elements being spaced apart,
a second electrically conductive end segment provided in electrical and mechanical communication with an upper end of said second electrically conductive post element and said second electrical lead of said semiconductor device, said first and second electrically conductive segments being spaced apart, and
an electrically isolating and thermally conductive element comprising
a longitudinal section extending longitudinally along a center of said heat sink post subassembly through the space between, and being engaged with, said first and second conductive post elements so as to provide electrical isolation of said first and second conductive post elements from one another,
an end section extending through the space between, and being engaged with, said first and second electrically conductive end segments so as to provide electrical isolation of said first and second conductive end segments from one another and mechanical support of said first and second conductive end segments, and
a top surface portion providing an electrically isolating and thermally conductive surface bonded to, and in thermal communication with said base portion of said semiconductor such that said thermally conductive element draws heat from said semiconductor device through said longitudinal section of said thermally conductive element to both said first and second conductive post elements and into the printed circuit board.

9. The heat sinking rapid assembly semiconductor package as recited in claim 8, wherein:
said semiconductor device further has a first electrical contact and a second electrical contact;
said first electrical lead of said semiconductor device comprises a first wire bond between said first conductive end segment and said first electrical contact of said semiconductor device so as to provide said electrical communication therebetween; and
said second electrical lead of said semiconductor device comprises a second wire bond between said second conductive end segment and said second electrical contact of said semiconductor device so as to provide said electrical communication therebetween.

10. The heat sinking rapid assembly semiconductor package as recited in claim 8, being assembled with the printed circuit board, comprising:
a first printed circuit board circuit; and
a second printed circuit board circuit being separate from said first printed circuit board circuit;
wherein said first conductive end segment and post element provide electrical communication between said first electrical lead of said semiconductor device and said first printed circuit board circuit; and wherein said second conductive end segment and post element provide electrical communication between said second electrical lead of said semiconductor device and said second printed circuit board circuit.

11. The heat sinking rapid assembly semiconductor package as recited in claim 8, further comprising a registration marker on said semiconductor device providing an orientation identifier being visible when viewing said heat sinking rapid assembly semiconductor package from a semiconductor carrying side thereof so as to indicate the orientation of said heat sinking rapid assembly semiconductor package relative to that of the printed circuit board.

12. The heat sinking rapid assembly semiconductor package as recited in claim 8, being assembled with a printed circuit board including at least one plated-through hole having said respective first and second electrically conductive portions being sized to mechanically accept and engage with said mechanical attachment interfaces of said first electrically conductive post element and said second electrically conductive post element.

13. The heat sinking rapid assembly semiconductor package as recited in claim 8, being assembled with a printed circuit board including at least one segmented plated-through hole comprising a first electrically conductive via segment and a second electrically conductive via segment being electrically isolated from one another and having said respective first and second electrically conductive portions being sized to mechanically accept and engage with said mechanical attachment interfaces of said first electrically conductive post element and said second electrically conductive post element.

14. The heat sinking rapid assembly semiconductor package as recited in claim 8, wherein said semiconductor device is a light emitting diode.

15. A heat sinking rapid assembly semiconductor package comprising:
  a semiconductor device having a first electrical lead and a second electrical lead; and
  a heat sink post subassembly comprising
    a first electrically conductive post element having a proximal end disposed near said semiconductor device and a distal end disposed remote from said semiconductor device, said first electrically conductive post element extending between said proximal and distal ends and along and forming a first longitudinal portion of a circumference of said heat sink post subassembly, said first electrically conductive post element including a first mechanical attachment interface disposed thereon being mechanically and electrically engaged with a first electrically conductive portion of a printed circuit board, said first conductive post element being provided in electrical communication with said first electrical lead of said semiconductor device,
    a second electrically conductive post element having a proximal end disposed near said semiconductor device and a distal end disposed remote from said semiconductor device, said second electrically conductive post element extending between said proximal and distal ends thereof and along and forming a second longitudinal portion of said circumference of said heat sink post subassembly, said second electrically conductive post element including a second mechanical attachment interface disposed thereon being mechanically and electrically engaged with a second electrically conductive portion of the printed circuit board, said second conductive post element being provided in electrical communication with said second electrical lead of said semiconductor device, said first and second electrically conductive post elements being spaced apart,
    a third electrically conductive post element comprising
      a proximal end disposed adjacent and coupled to said semiconductor device,
      a distal end disposed remote from said semiconductor device,
      an elongated section extending between and interconnecting said proximal and distal ends, said elongated section extending along and between said respective first and second longitudinal portions of said first and second electrically conductive post elements and also being spaced from said first and second electrically conductive post elements, and
      a first broadened mechanical attachment interface electrically conductive distal section connected at and extending outwardly from said distal end of said elongated section and spaced from said distal ends of said first and second electrically conductive post elements, and
    an electrically isolating and thermally conductive element comprising
      a proximal end disposed adjacent and coupled to said semiconductor device,
      a distal end remote from said semiconductor device, said electrically isolating and thermally conductive element extending between said proximal and distal ends thereof through the space between said first, second and third electrically conductive post elements so as to provide electrical isolation of one from the others, and
      a second broadened mechanical attachment interface electrically isolating and thermally conductive distal section connected at and extending outwardly from said distal end of said electrically isolating and thermally conductive element between said first broadened mechanical attachment interface electrically conductive distal section of said third electrically conductive post element and said distal ends of said first and second electrically conductive post elements.

16. The heat sinking rapid assembly semiconductor package as recited in claim 15, wherein:
  said semiconductor device further has a first electrical contact and a second electrical contact;
  said first electrical lead of said semiconductor device comprises a first wire bond between said first electrical contact of said semiconductor device and said first conductive post element of said heat sink post subassembly so as to provide said electrical communication therebetween; and
  said second electrical lead of said semiconductor device comprises a second wire bond between said second electrical contact of said semiconductor device and said second conductive post element of said heat sink post subassembly so as to provide said electrical communication therebetween.

17. The heat sinking rapid assembly semiconductor package as recited in claim 15, being assembled with the printed circuit board, comprising:
  a first printed circuit board circuit;

a second printed circuit board circuit being separate from said first printed circuit board circuit; and a base printed circuit board layer, wherein said base printed circuit board layer provides at least one of electrical communication and thermal communication between said base printed circuit board layer and said third electrically conductive post element;

wherein said first conductive post element provides electrical communication between said first electrical lead of said semiconductor device and said first printed circuit board circuit; and wherein said second conductive post element provides electrical communication between said second electrical lead of said semiconductor device and said second printed circuit board circuit.

18. The heat sinking rapid assembly semiconductor package as recited in claim 15, further comprising a registration marker on said semiconductor device providing an orientation identifier being visible when viewing said heat sinking rapid assembly semiconductor package from a semiconductor carrying side thereof so as to indicate the orientation of said heat sinking rapid assembly semiconductor package relative to the printed circuit board.

19. The heat sinking rapid assembly semiconductor package as recited in claim 15, being assembled with a printed circuit board including at least one plated-through hole having said respective first and second electrically conductive portions being sized to mechanically accept and engage with said mechanical attachment interfaces of said first electrically conductive post element and said second electrically conductive post element.

20. The heat sinking rapid assembly semiconductor package as recited in claim 15, being assembled with a printed circuit board including at least one segmented plated-through hole comprising a first electrically conductive via segment and a second electrically conductive via segment being electrically isolated from one another and having said respective first and second electrically conductive portions being sized to mechanically accept and engage with said mechanical attachment interfaces of said first electrically conductive post element and said second electrically conductive post element.

21. The heat sinking rapid assembly semiconductor package as recited in claim 15, wherein said semiconductor device is a light emitting diode.

\* \* \* \* \*